United States Patent
Sidhu et al.

(10) Patent No.: US 7,465,971 B2
(45) Date of Patent: Dec. 16, 2008

(54) INTEGRATED CIRCUIT STRUCTURES FOR INCREASING RESISTANCE TO SINGLE EVENT UPSET

(75) Inventors: Lakhbeer S. Sidhu, San Jose, CA (US); Irfan Rahim, San Jose, CA (US); Jeffrey Watt, Palo Alto, CA (US); John Turner, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/951,122

(22) Filed: Dec. 5, 2007

(65) Prior Publication Data

US 2008/0074145 A1    Mar. 27, 2008

Related U.S. Application Data

(62) Division of application No. 10/883,091, filed on Jul. 1, 2004, now Pat. No. 7,319,253.

(51) Int. Cl.
    *H01L 29/94* (2006.01)
(52) U.S. Cl. .................. 257/203; 257/202; 257/298
(58) Field of Classification Search .............. 257/202, 257/203, 298
    See application file for complete search history.

(56) References Cited

U.S. PATENT DOCUMENTS

| | | |
|---|---|---|
| 4,513,167 A | 4/1985 | Brandstetter |
| 4,890,148 A | 12/1989 | Ikeda et al. |
| 5,677,866 A | 10/1997 | Kinoshita |
| 5,739,564 A | 4/1998 | Kosa et al. |
| 5,859,544 A | 1/1999 | Norman et al. |
| 6,111,780 A | 8/2000 | Bertin |
| 6,259,643 B1 | 7/2001 | Li |
| 6,368,514 B1 | 4/2002 | Metzler |
| 6,501,677 B1 | 12/2002 | Rau Prasad et al. |
| 6,737,712 B2 | 5/2004 | Hashimoto et al. |
| 6,876,572 B2 | 4/2005 | Turner |

FOREIGN PATENT DOCUMENTS

EP    0357 980 B1    3/1990

*Primary Examiner*—Douglas M Menz
(74) *Attorney, Agent, or Firm*—Ropes & Gray LLP

(57) ABSTRACT

A configuration memory cell ("CRAM") for a field programmable gate array ("FPGA") integrated circuit ("IC") device is given increased resistance to single event upset ("SEU"). A portion of the gate structure of the input node of the CRAM is increased in size relative to the nominal size of the remainder of the gate structure. Part of the enlarged gate structure is located capacitively adjacent to an N-well region of the IC, and another part is located capacitively adjacent to a P-well region of the IC. This arrangement gives the input node increased capacitance to resist SEU, regardless of the logical level of the input node. The invention is also applicable to any node of any type of memory cell for which increased resistance to SEU is desired.

13 Claims, 5 Drawing Sheets

INTEGRATED CIRCUIT STRUCTURES FOR INCREASING RESISTANCE TO SINGLE EVENT UPSET

CROSS REFERENCE TO RELATED APPLICATION

This is a division of, commonly-assigned U.S. patent application Ser. No. 10/883,091, filed Jul. 1, 2004, now U.S. Pat. No. 7,319,253, which is hereby incorporated by reference herein in its entirety.

BACKGROUND OF THE INVENTION

This invention relates to integrated circuit ("IC") devices, and more particularly IC structures that increase the resistance of the IC to certain kinds of memory errors due to such causes as alpha particles and atmospheric neutrons.

An event such as an alpha particle or atmospheric neutron travelling through the material of an IC can cause ionization of that material in the vicinity of the event. The electrical charge(s) resulting from that ionization can flow to the electrical circuitry of the IC and cause errors in that circuitry. For example, a memory cell may depend on a node of the memory cell remaining at a certain electrical potential (voltage) in order for the memory cell to hold a stored data value. A sufficiently rapid flow of a sufficiently large amount of electrical charge to that node as a result of an event like that described above may cause the node to deviate from the required potential and thereby cause the memory cell to "flip" to outputting an incorrect data value. This type of occurrence may be referred to as a single event upset ("SEU"). It may also be known as a soft error upset, soft error rate ("SER"), or the like. An SEU can cause the affected IC to malfunction. This can cause a system that includes the affected IC to malfunction. ICs tend to become more susceptible to SEU as IC feature sized decreases, which, of course, is one of the more important trends in IC fabrication.

SUMMARY OF THE INVENTION

In accordance with this invention, an IC node that may be susceptible to SEU is given increased resistance to such an event by increasing its capacitance. Moreover, this capacitance preferably includes two portions. One portion includes having a first capacitor terminal connected to a source of relatively high or positive potential (e.g., VCC). A second portion includes having a second capacitor terminal connected to a source of relatively low or negative potential (e.g., VSS). The IC circuit node being protected against SEU is a third capacitor terminal that is capacitively couplable to either the first terminal or the second terminal. As a consequence of this arrangement, whichever potential (or logical) state the IC circuit node is intended to be in, its capacitance is significantly increased by its capacitive coupling to the first or second terminal having opposite potential. This increased capacitance of the IC node gives that node greater robustness to resist SEU.

Further features of the invention, its nature and various advantages will be more apparent from the accompanying drawings and the following detailed description.

DETAILED DESCRIPTION

Figure 1:
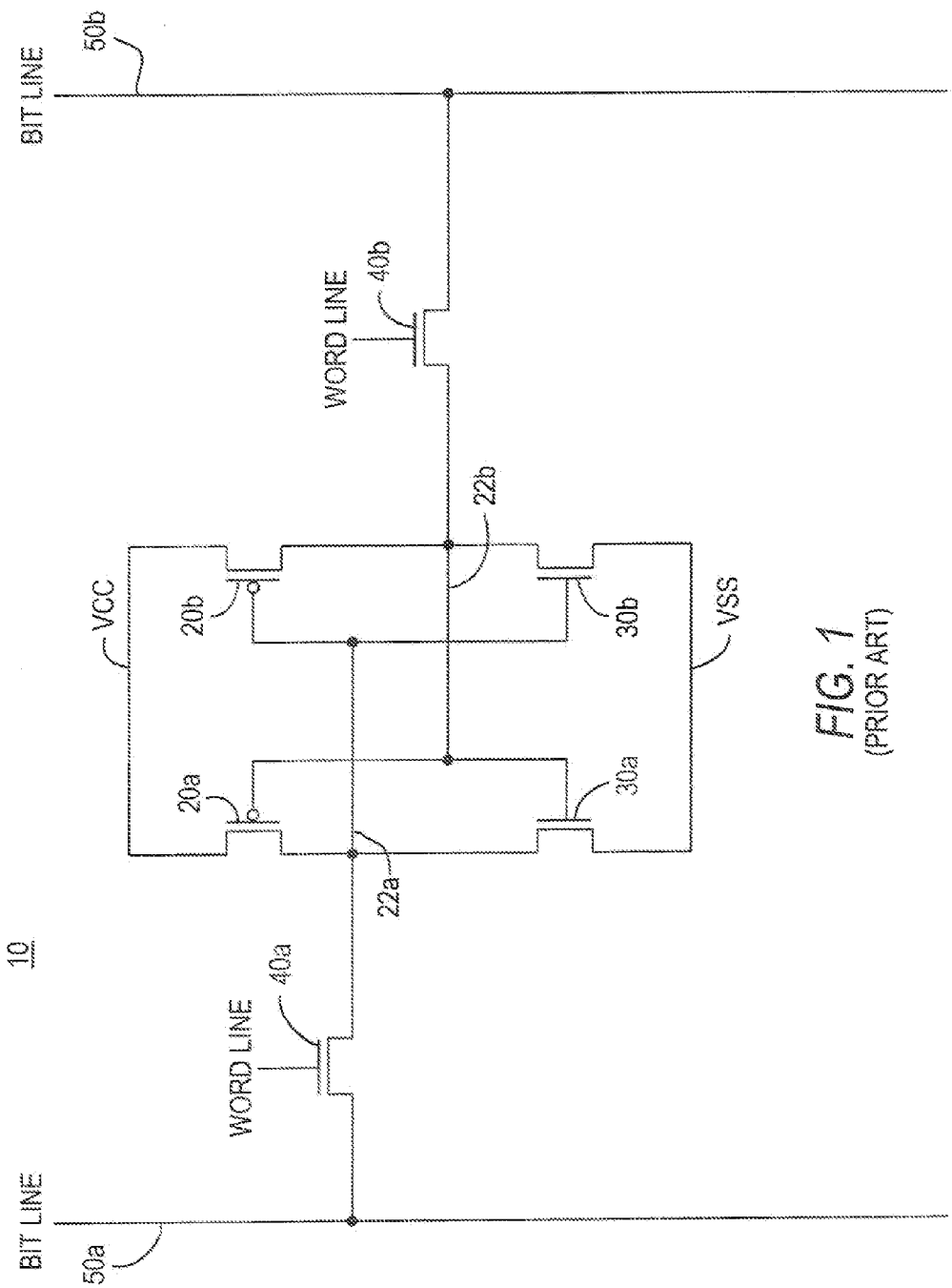
FIG. 1 is a simplified schematic diagram of a conventional static random access memory ("SRAM") cell.

FIG. 1 shows a conventional static random access memory ("SRAM") cell 10 of the type that may be used, for example, on a field programmable gate array ("FPGA") IC. For example, cells of this type may be used to provide blocks of random access memory (so-called "user RAM") on an FPGA. In cell 10, PMOS transistor 20a is connected in series with NMOS transistor 30a between a source of relatively high electrical potential VCC (or logic 1) and a source of relatively low electrical potential VSS (or logic 0 or ground). PMOS transistor 20b is similarly connected in series with NMOS transistor 30b between VCC and VSS. Node 22a is connected between transistors 20a and 30a and between the gates of transistors 20b and 30b. Node 22b is connected between transistors 20b and 30b and between the gates of transistors 20a and 30a. Node 22a is selectively connectable to bit line 50a via NMOS transistor 40a. Node 22b is selectively connectable to bit line 50b via NMOS transistor 40b.

When it is desired to write data into cell 10, that data is applied to bit lines 50a and 50b in complementary form, and transistors 40a and 40b are enabled by a word line signal applied to their gates. This impresses the data to be written on cell 10 (regardless of the cell's previous state). For example, if bit line 50a is high (logic 1) and bit line 50b is low (logic 0) when transistors 40a and 40b are enabled, then node 22a is driven high and node 22b is driven low. When transistors 40a and 40b are subsequently disabled, memory cell 10 continues to hold nodes 22a and 22b in these states. The memory cell can be subsequently read by again enabling transistors 40a and 40b, this time with no other significant drive applied to bit lines 50a and 50b. This allows the memory cell to drive the bit lines to the complementary potentials of nodes 22a and 22b. The content of the memory cell can thereby be read by sensing the logic levels of bit lines 50a and 50b.

Although SRAM cell 10 is stable in either of two states (i.e., node 22a high and node 22b low, or node 22a low and node 22b high) in the absence of external, data-writing drive from bit lines 50a and 50b as described above, SEU can erroneously change the state of such a cell, and the risk of such an error tends to increase as the components of the cell are made smaller. This is so because the smaller the components of the cell become, the less inherent capacitance the circuit has to resist SEU.

Figure 2:
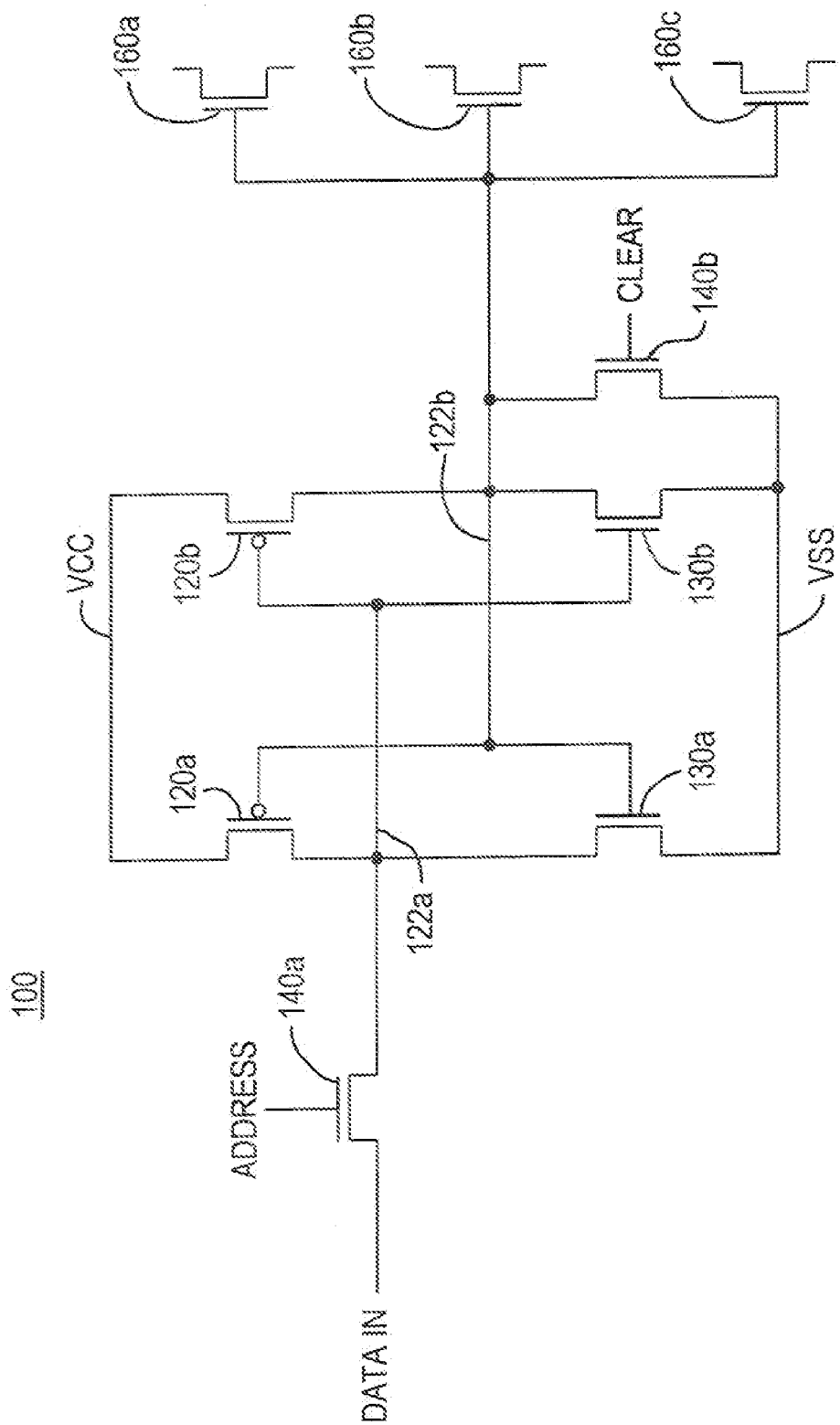
FIG. 2 is a simplified schematic diagram of an illustrative embodiment of a configuration random access memory ("CRAM") cell which can be constructed in accordance with the invention.

Many memory cells in FPGAs are provided for "routing") circuitry of the FPGA. Indeed, in many FPGA architectures there can be significantly more of this type of "configuration RAM" or "CRAM" cells than other types of memory cells. A typical CRAM cell 100 of this type is shown in FIG. 2. From a circuit schematic perspective, the core of this CRAM cell can be similar to the core of RAM cell 10 in FIG. 1. These "core" elements are 120a, 130a, 120b, 130b, 122a, and 122b in FIG. 2 (corresponding, respectively, to elements 20a, 30a, 20b, 30b, 22a, and 22b in FIG. 1). The core of CRAM cell 100 therefore operates like the core of SRAM cell 10 in FIG. 1, and these operations will accordingly not need to be described again. CRAM cell 100 typically controls several pass gate transistors (e.g., 160a, 160b, and 160c) in the programmable routing resources of the FPGA. In particular, node 122b is the output node of CRAM cell 100, which is connected to the gates of pass transistors 160. Although CRAM cell 100 is shown controlling three pass gates 160 in FIG. 2, this number can be different at different locations in the FPGA or in different FPGA architectures.

CRAM cell 100 is programmed (or reprogrammed) by enabling NMOS transistor 140a (using a gate-enabling address signal applied to the gate of that transistor). This allows a data in signal to be applied to node 122a of the cell, thereby programming (or reprogramming) the cell to the data in value. The cell can be cleared (to subsequently output logic 0) by applying a clear signal to the gate of NMOS transistor 140b, This connects node 122b to VSS, which causes the cell to thereafter output logic 0, at least until different data is stored in the cell from the data in lead as described above.

CRAM cells like 100 are typically programmed/reprogrammed/cleared relatively infrequently. For example, they may be cleared and then programmed each time the FPGA, of which they are part, is turned on (powered); and they may also be cleared and then programmed/reprogrammed under certain device clear/reset/restart conditions. Again, however, these programming/reprogramming/clearing events tend to be relatively infrequent and less speed-critical than the normal-operating-mode operations of the device. In other words, it is generally acceptable for the response time of memory cells like CRAM 100 to clearing, programming, and/or reprogramming to be longer than the response time (during normal operations) of user RAM and other circuitry on the device. Nevertheless, because there are typically so many CRAMs like 100 on an FPGA, there is constant pressure to reduce the size of these cells (just as there is pressure to reduce the size of these cells (just as there is pressure to reduce the size of all other components that contribute significantly to the overall size of the device.

Because output node 122b is typically connected to the gates of several pass transistors 160 as shown in FIG. 2, the inherent capacitance of this node tends to be relatively high as compared, for example, to the inherent capacitance of what may be termed (in this case) input node 122a. Accordingly, output node 122b tends to have inherently greater resistance to SEU than input node 122a, even for very small CRAM cells for which the risk of SEU is increased. One of the objectives of this invention is to boost the capacitance of input node 122a in CRAM cells like 100 to increase the SEU resistance of that node, and to accomplish this without significantly increasing the size of the CRAM cell.

Figure 3:
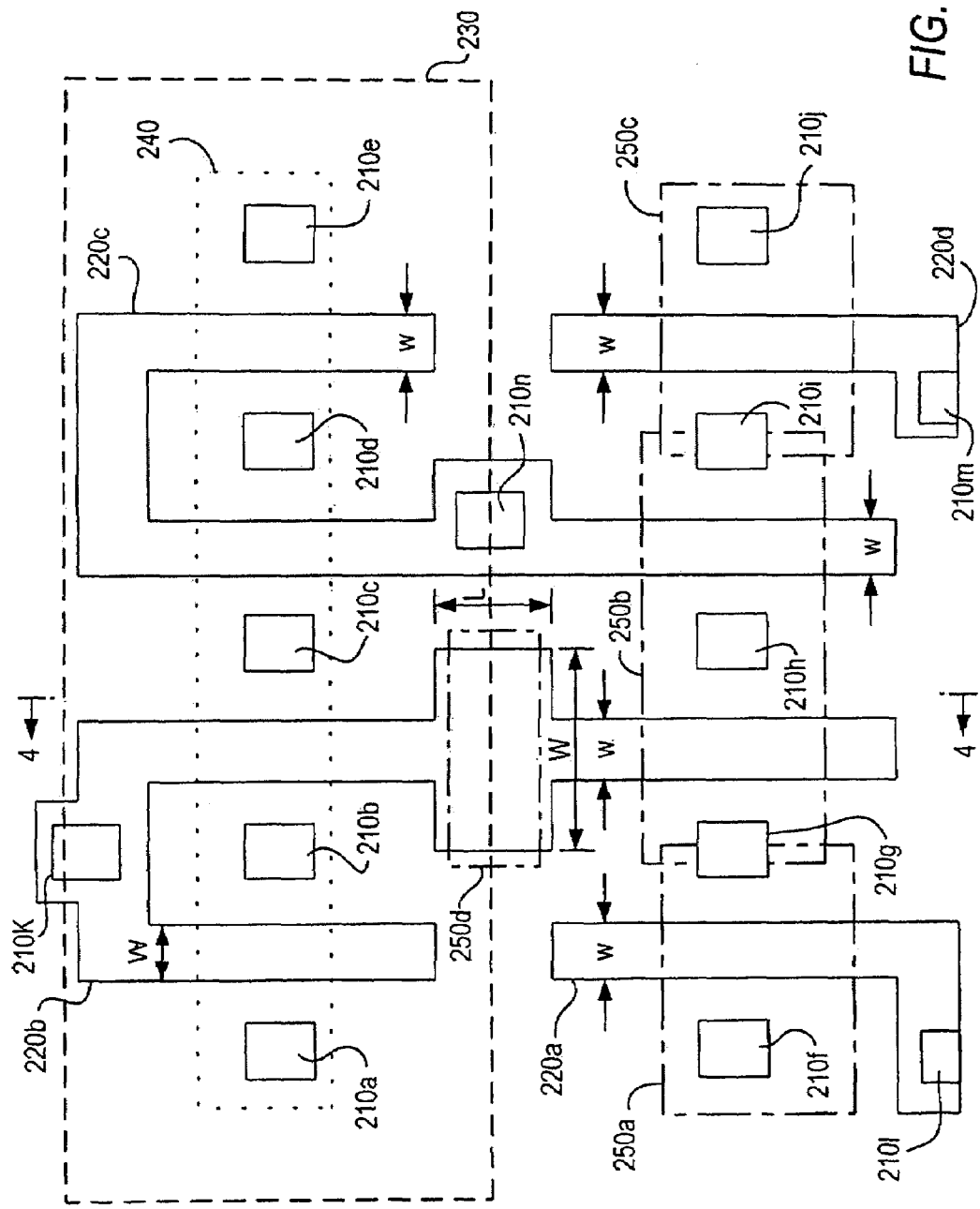
FIG. 3 is a simplified plan view of certain layers of an illustrative integrated circuit ("IC") implementation of the FIG. 2 circuitry in accordance with the invention.

FIG. 3 shows an illustrative layout of CRAM cell 100 on an IC in accordance with this invention. In FIG. 3 elements 210a-n are contacts. Contacts 210 are connected to metal conductors in one or more layers above what is shown in FIG. 3 (see, for example, FIG. 5, which shows such conductor connections schematically). Elements 220a-d are electrically conductive poly gate material. Dashed line 230 indicates the boundary of an N-well (in a P-type substrate 260 (FIG. 4) of the device). Dotted line 240 indicates the boundary of a region of P-type material (in N-well 230). Chain-dashed lines 250a-d indicate the boundaries of regions of N-type material (in the above-mentioned P-type substrate). Shallow trench isolation ("STI") (i.e., an oxide in a trench) is provided as appropriate to isolate various features from one another (see, for example, FIG. 4, in which representative STI regions 270a and 270b are shown). The upper portion of what is shown in FIG. 3 includes the PMOS portion 120a and 120b of the core of CRAM cell 100. The lower portion of FIG. 3 includes the NMOS portion 130a and 130b of the CRAM core.

The table below correlates various features shown in FIG. 3 to portions of the FIG. 2 circuit schematic.

| FIG. 3 | FIG. 2 |
| --- | --- |
| Contact 210a | Source of 120b |
| Contact 210b | Drain of 120b |
| Contact 210c | Source of 120a and 120b |
| Contact 210d | Drain of 120a |
| Contact 210e | Source of 120a |
| Contact 210f | Drain of 140b |
| Contact 210g | Source of 140a and drain of 130a |
| Contact 210h (connected by metal (FIG. 5) to contact 210j) | Source at 130a and source of 130b |
| Contact 210i | Drain of 130a and 140a |
| Contact 210j | Source of 140a |
| Contact 210k (connected by metal (FIG. 5) to contacts 210d and 210i) | Input node 122a |
| Contact 210l | Clear input terminal |
| Contact 210m | Address input terminal |
| Contact 210n (connected by metal (FIG. 5) to contacts 210b and 210g) | Output node 122b |
| Gate 220a | Gate of 140b |
| Gate 220b | Gates of 120b and 130b |
| Gate 220c | Gates of 120a and 130a |
| Gate 220d | Gate of 140a |

In order to increase the capacitance of node 122a (FIG. 2; implemented in FIG. 3 as contact 210k (which, as noted above, is connected to contacts 210d and 210i) and gate 220b), the structure of gate 220b is modified in accordance with the invention as will now be described. Adjacent to and spanning a boundary 232 (FIG. 4) between N-well 230 and P-well 260, gate 220b is widened so that it extends along boundary 232 much more than it otherwise would in crossing that boundary. In FIG. 3 the normal or nominal width of gate 220b is w. (Note that in this (illustrative embodiment w is also the nominal width of other gate structures 220a, 220c, and 220d.) The much greater width of gate 220b in the vicinity of boundary 232 is W. The length of the widened portion of gate 220b (substantially perpendicular to W) is L.

Figure 4:
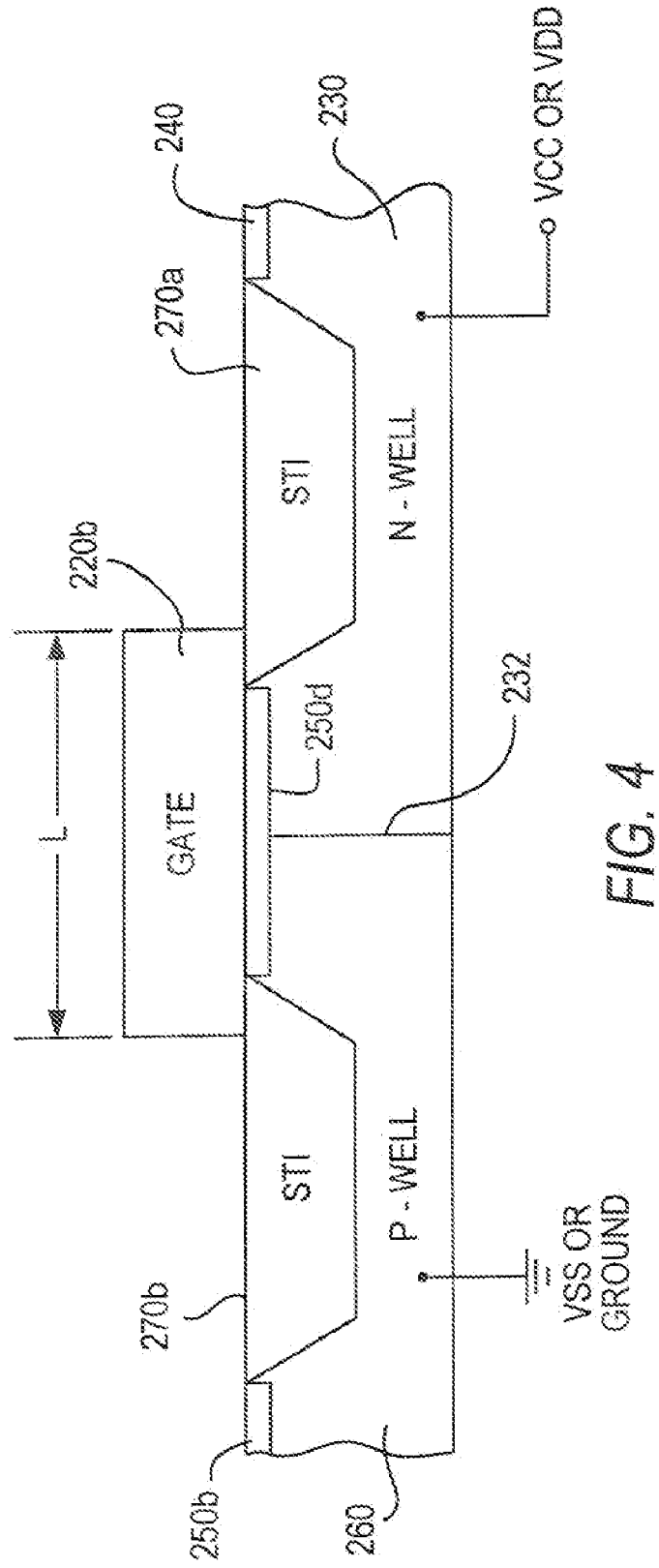
FIG. 4 is a simplified sectional view taken along the line 4-4 in FIG. 3.
Figure 5:
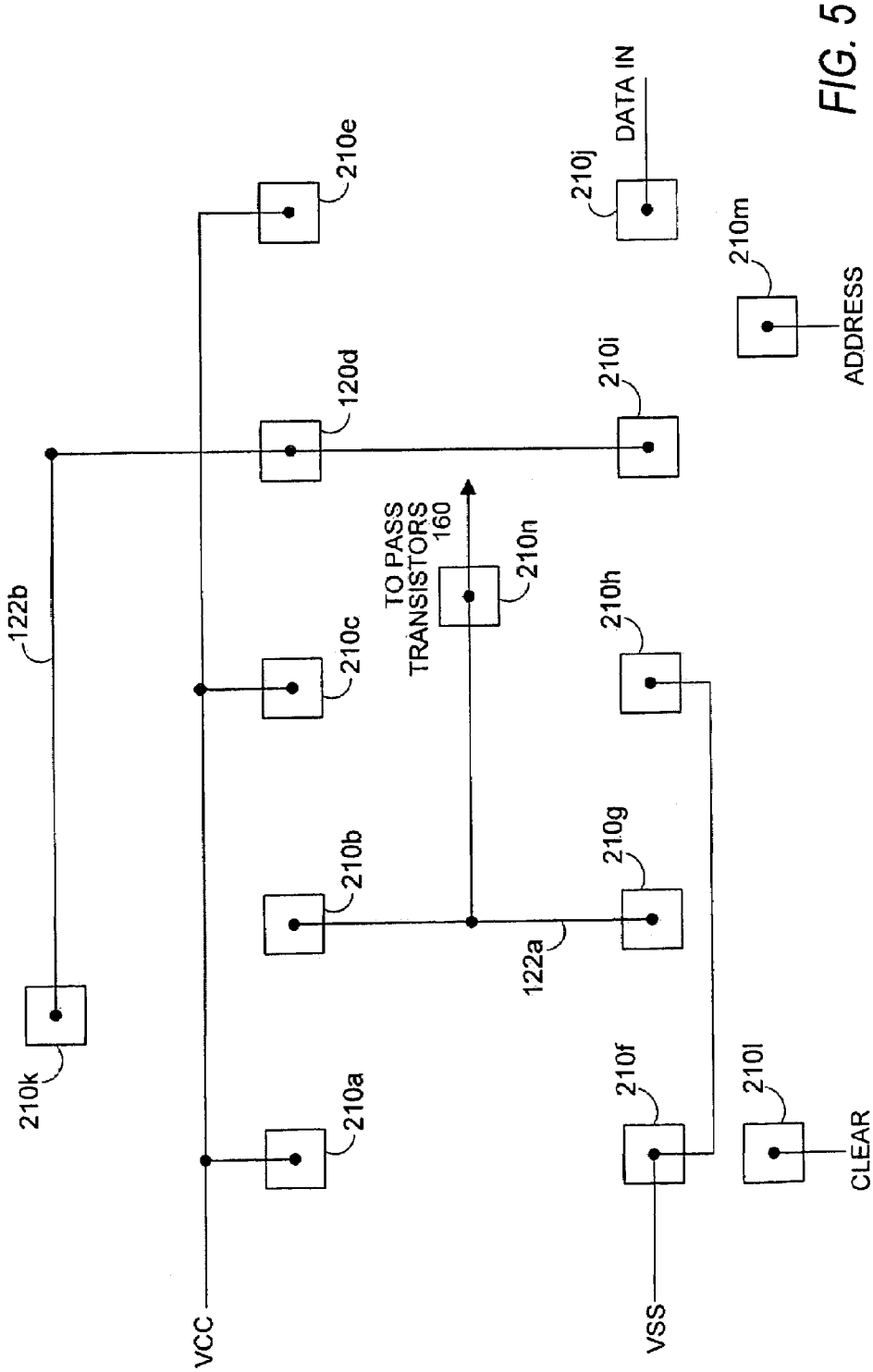
FIG. 5 repeats some of the elements shown in FIG. 3 with some additional connections shown in simplified form.

The portion of gate 220b shown in FIG. 4 is electrically isolated from underlying N-well 230 and P-well 260 by intervening layer 250d of N-type material and by STI 270a and 270b. N-well 230 is electrically connected to VCC (or VDD, which may be an even higher potential than VCC). P-well 260 is connected to ground or VSS. Accordingly, the structure shown in FIG. 4 has capacitor characteristics as follows. Gate 220b is one terminal of the capacitor. N-well 230 is another terminal of the capacitor, which other terminal becomes capacitively significant when gate 220b is at or close to logic 0 (opposite to the VCC or VDD potential) of N-well 230). Alternatively, the other terminal of the capacitor is P-well 260, which other terminal becomes capacitively significant when gate 220b is at or close to logic 1 (opposite to the VSS or ground potential of P-well 260). The dielectric of the capacitor is the material 250d, 270a, and 270b between gate 220b, on one hand, and N-well 230 and P-well 260, on the other hand.

Enlarging gate 220b as described above significantly increases the capacitance of input node 122a. This is so because this enlargement of gate 220b increases the capacitive coupling between the gate and either N-well 230 or P-well 260, depending on the potential of the gate. For example, if gate 220b is at or near logic 0, there is increased capacitive coupling to N-well 230 (at VCC or VDD) due to the enlargement of gate 220b over N-well 230. This helps prevent gate 220b from changing state to logic 1 in the event of a rush of positive charge to gate 220b due to SEU. Similarly, if gate 220b is at or near logic 1, there is increased capacitive coupling to P-well 260 (at VSS or ground) due to the enlargement of gate 220b over P-well 260. This helps prevent gate 220b from changing state to logic 0 in the event of a rush of negative charge to gate 220b due to SEU. Node 122a is thereby given greater resistance to SEU. (Node 122b already has greater resistance to SEU due to its connection to the gates of several routing pass gates 160 as described earlier in this specification.)

Adding capacitance to CRAM 100 as described above is not a performance issue because (as mentioned earlier) the speed of operation of CRAMs is not as important as the speed of operation of other memory cells that are used during normal operation of the device. Adding capacitance to CRAM 100 as described above also does not increase the area occupied by the CRAM on the IC that includes it. Gate 220b has been enlarged in CRAM 100 at a location where the CRAM can accept that enlargement without the CRAM itself becoming any larger. For example, the spacings of contacts 210a-210j in both the vertical and horizontal directions can be the same or substantially the same after addition of the invention as prior to addition of the invention.

Although W and L (FIG. 3) can have a wide range of values, W is preferably at least about 2w, more preferably at least about 3w. L is preferably at least about w, more preferably at least about 2w.

Other strategies for increasing resistance to SEU can be used together with what is described above if desired. One of these strategies is the use of folded gates. Examples of folded gates are shown in FIG. 3, wherein gate structure 220b is folded around contact 210b and gate structure 220c is folded around contact 210d. Folded gates like there result in reduced collection area as compared to standard gates. For example, a folded gate can reduce collection area by about 40%. This produces a corresponding reduction in the probability of an SEU affecting the gate.

It will be understood that the foregoing is only illustrative of the principles of the invention, and that various modifications can be made by those skilled in the art without departing from the scope and spirit of the invention. For example, the arrangement of contacts 210 and gates 220 shown in FIG. 3 is only one example of the possible arrangements of such components. Other arrangements will occur to those skilled in the art as a matter of routing variation. Similarly, other placements and/or arrangements of the enlarged portion (L×W) of gate 220b will occur to those skilled in the art as a matter of routing variation. The invention can also be used in SOI (silicon on insulator devices. Similarly, although the invention has been described primarily in the context of its application to CRAM cells, it will be understood that it is applicable to any node of any type of memory cell for which it is desired to increase resistance to SEU.

The invention claimed is:

1. Integrated circuitry for controlling signal-routing pass transistors that are also part of the integrated circuitry comprising:
    first and second PMOS transistors;
    first and second NMOS transistors, each of which is connected in series with a respective one of the PMOS transistors between a source of relatively high potential and a source of relatively low potential;
    an output node connected in series between the second PMOS transistor and the second NMOS transistor, the output node also being connected to gate circuitry of the first PMOS transistor, the first NMOS transistor, and the pass transistors; and
    an input node connected in series between the first PMOS transistor and the first NMOS transistor, the input node also being connected to gate circuitry of the second PMOS transistor and the second NMOS transistor, the gate circuitry of at least one of the second PMOS and second NMOS transistors including a portion that is enlarged to increase capacitance of the input node.

2. The integrated circuitry defined in claim 1 wherein the portion is enlarged by being increased in width W relative to nominal width w outside the portion.

3. The integrated circuitry defined in claim 2 wherein W is at least about 2 w.

4. The integrated circuitry defined in claim 3 wherein W is at least about 3 w.

5. The integrated circuitry defined in claim 2 wherein a dimension L of the portion substantially perpendicular to W is at least about w.

6. The integrated circuitry defined in claim 5 wherein L is at least about 2 w.

7. The integrated circuitry defined in claim 1 further comprising:
    an N-well region capacitively proximate to a first part of the portion and connected to a source of relatively high potential; and
    a P-well region capacitively proximate to a second part of the portion and connected to a source of relatively low potential.

8. The integrated circuitry defined in claim 7 wherein the first and second parts are approximately equal in size.

9. The integrated circuitry defined in claim 1 wherein portion is enlarged by being increased in width W relative to nominal width w of the gate circuitry of the first PMOS transistor and the first NMOS transistor.

10. The integrated circuitry defined in claim 9 wherein W is at least about 2w.

11. The integrated circuitry defined in claim 10 wherein W is at least about 3w.

12. The integrated circuitry defined in claim 9 wherein a dimension L of the portion substantially perpendicular to W is at least about w.

13. The integrated circuitry defined in claim 12 wherein L is at least about 2w.

* * * * *